United States Patent [19]

Yu et al.

[11] Patent Number: 6,060,581
[45] Date of Patent: *May 9, 2000

[54] OPTICAL ALIGNMENT POLYMER, OPTICAL COMPOSITION, ALIGNMENT LAYER FORMED USING THE SAME AND LCD HAVING THE ALIGNMENT LAYER

[75] Inventors: Han-sung Yu; Yong-kyu Jang, both of Suwon, Rep. of Korea

[73] Assignee: Samsung Display Devices Co., Ltd., Kyungki-do, Rep. of Korea

[*] Notice: This patent is subject to a terminal disclaimer.

[21] Appl. No.: 08/988,206

[22] Filed: Dec. 10, 1997

[30] Foreign Application Priority Data

Dec. 17, 1996 [KR] Rep. of Korea ............... 96-67053

[51] Int. Cl.⁷ .................................................. C08G 73/10
[52] U.S. Cl. ..................... 528/353; 528/125; 528/128; 528/170; 528/171; 528/172; 528/173; 528/174; 528/176; 528/183; 528/188; 528/220; 528/229; 528/350; 430/170; 430/286; 428/1; 428/493.5

[58] Field of Search ..................... 430/286, 170; 528/125, 128, 172, 173, 174, 171, 176, 183, 188, 220, 353, 229, 170, 350, 322; 428/1, 473.5

[56] References Cited

U.S. PATENT DOCUMENTS 5,145,940 9/1992 Wernet et al. ........................ 528/226
5,800,952 9/1998 Urano et al. ........................ 522/167

Primary Examiner—P. Hampton-Hightower
Attorney, Agent, or Firm—Lowe Hauptman Gopstein Gilman & Berner

[57] ABSTRACT

An optical alignment composition including self-photosensitive polyimide having a benzophenone moiety and an active hydrogen moiety, and an LCD having the alignment layer formed of the optical alignment composition are provided. Since the alignment layer with excellent thermal stability and improved pretilt angle is obtained, the LCD having excellent performance can be manufactured.

15 Claims, 1 Drawing Sheet

OPTICAL ALIGNMENT POLYMER, OPTICAL COMPOSITION, ALIGNMENT LAYER FORMED USING THE SAME AND LCD HAVING THE ALIGNMENT LAYER

BACKGROUND OF THE INVENTION

1. Field of the Invention

The present invention relates to a liquid crystal display device (LCD), and more particularly, to an optical alignment polymer having excellent thermal stability and improving pretilt angle characteristic of a liquid crystal, an optical alignment composition comprising the optical alignment polymer, an alignment layer formed using the composition, and an LCD having the alignment layer.

2. Description of the Related Art

In general, as shown in FIG. 1, an LCD has a pair of upper and lower substrates 2 and 2' spaced apart from each other and opposed to each other. Transparent electrode layers 3 and 3' are formed on the upper and lower substrates 2 and 2'. Insulating layers 4 and 4' and alignment layers 5 and 5' are sequentially formed on the transparent electrodes 3 and 3'. A liquid crystal layer 7 is formed in the space between the upper and lower substrates 2 and 2'. Polarizing plates 1 and 1' for polarizing entering and transmitting lights are provided to the exterior of the substrates 2 and 2', respectively.

In the LCD having the aforementioned structure, according to an externally applied voltage, the arrangement of liquid crystals influenced by the electric field is changed. According to the changed arrangement, external light introduced to the LCD is shielded or transmitted. The LCD is driven by such a property. In other words, if a voltage is applied to the transparent electrode layers 3 and 3', an electric field is formed in the liquid crystal layer 7. Thus, liquid crystals are driven in a predetermined direction. The light introduced into the liquid crystals of the LCD is shielded or transmitted according to the driving of the liquid crystals.

The functions of the LCD as a display device, i.e., light transmittance, response time, view angle or contrast, are determined by the arrangement characteristic of the liquid crystal molecules. Therefore, a technology of controlling the alignment of the liquid crystal molecules uniformly is a very important factor.

The uniform alignment state of the liquid crystals is difficult to accomplish by merely interposing the liquid crystals between the upper and lower substrates. Thus, as shown in FIG. 1, it is general to form the alignment layers 5 and 5' for aligning liquid crystals on the transparent electrode layers 3 and 3'.

The alignment layer is conventionally formed by a rubbing method in which a thin film made of an organic polymer material such as polyimide or polyamide is formed, cured and then rubbed with a special cloth.

The rubbing method is easy to conduct and the process thereof is simple. However, minute particles or materials such as cellulose may separate from the cloth used in the rubbing treatment to contaminate the alignment layer. Further, depending on the material for forming the alignment layer, the alignment may not be accomplished smoothly. A thin film transistor may be damaged by static electricity generated during the rubbing treatment.

To solve the above-described problems, an optical alignment technology has been developed in which dust, static electricity or other pollutant particles are not generated and cleanliness is maintained during the overall process. According to such a non-destructive alignment method, polarized light is irradiated onto the optical alignment layer to cause anisotropic photopolymerization. As a result, the optical alignment layer has alignment characteristic, thereby uniformly aligning the liquid crystals. The polymer for the optical alignment layer includes polyvinylcinnamate (PVCN) and polyvinylmethoxyxinnamate (PVMC). However, such polymers have poor thermal stability, although they have an excellent optical alignment property. In other words, the thermal stability of an alignment layer depends upon that of the polymer, which depends upon a glass transition point and cross linking density. Since the PVCN or PVMC has a relatively glass transition point of 100° C. or below, so that post-alignment thermal stability is decreased. Further, the pretilt angle of the liquid crystal drops to almost 0° due to a symmetry structure obtained after cross-linking reaction.

SUMMARY OF THE INVENTION

To solve the above problem(s), it is an object of the present invention to provide an optical alignment polymer having excellent thermal stability and excellent pretilt angle characteristic of a liquid crystal.

It is another object of the present invention to provide an optical alignment composition comprising the optical alignment polymer.

It is still another object of the present invention to provide a liquid crystal display device (LCD) having the alignment layer formed of the optical alignment composition.

Accordingly, to achieve the first object, there is a self-photosensitive polyimide having a benzophenone moiety and an active hydrogen moiety and represented by the formula 1:

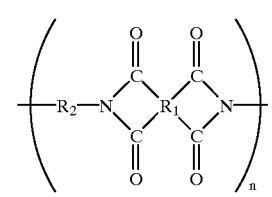

where $R_1$ is

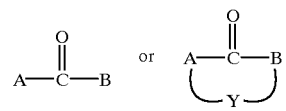

and $R_2$ is E-CH$_2$-F [Here, A and B are each independently selected and are unsubstituted aromatic group ring (Here, the aromatic group ring is a monocyclic ring of six carbon atoms, a bicyclic ring of ten carbon atoms or a tricyclic ring of fourteen carbon atoms.), and Y is a heteroatom selected from oxygen (O), sulfur (S) and nitrogen (N), E and F are each independently selected from the group consisting of an unsubstituted aromatic group ring, an aromatic group ring having at least one substitute (G) (Here, the aromatic group ring is a monocyclic ring of six carbon atoms, a bicyclic ring of ten carbon atoms or a tricyclic ring of fourteen carbon atoms.), a $C_3$–$C_{10}$ cycloalkyl, a $C_3$–$C_{10}$ cycloalkyl having at least one substituent (G), a $C_3$–$C_{10}$ cycloalkenyl, a $C_3$–$C_{10}$ cycloalkenyl having at least one substituent (G) (Here, the substituent (G) is selected from the group consisting of a $C_1$–$C_{10}$ alkyl, an aromatic, unsubstituted or substituted amino, a halide, hydroxy (OH), nitro ($NO_2$), cyano (CN), thiocyano (SCN), thiol (SH) and carboxyl (COOH)) groups.

In the above formula, $R_1$ is selected from the group consisting of:

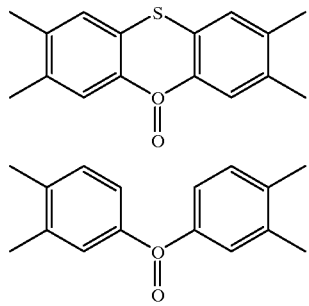

, and $R_2$ is selected from the group consisting of:

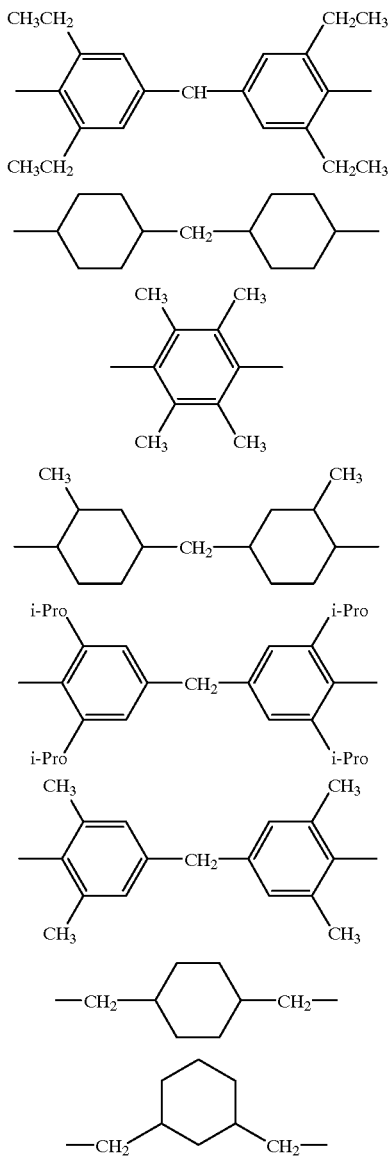

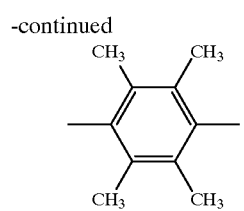

The second object of the present invention is achieved by an alignment composition comprising a self-photosensitive polyimide having a benzophenone moiety and an active hydrogen moiety and represented by the formula (1).

The third object of the present invention is achieved by a liquid crystal display (LCD) comprising a pair of upper and lower substrates opposed to each other, transparent electrodes formed on the upper and lower substrates, alignment layers formed on the transparent electrodes and a liquid crystal layer between the alignment layers, wherein the alignment layer comprises self-photosensitive polyimide having a benzophenone moiety and an active hydrogen moiety and represented by the formula 1.

BRIEF DESCRIPTION OF THE DRAWINGS

The above objects and advantages of the present invention will become more apparent by describing in detail a preferred embodiment thereof with reference to the attached drawing in which.

DESCRIPTION OF THE PREFERRED EMBODIMENTS

Figure 1:
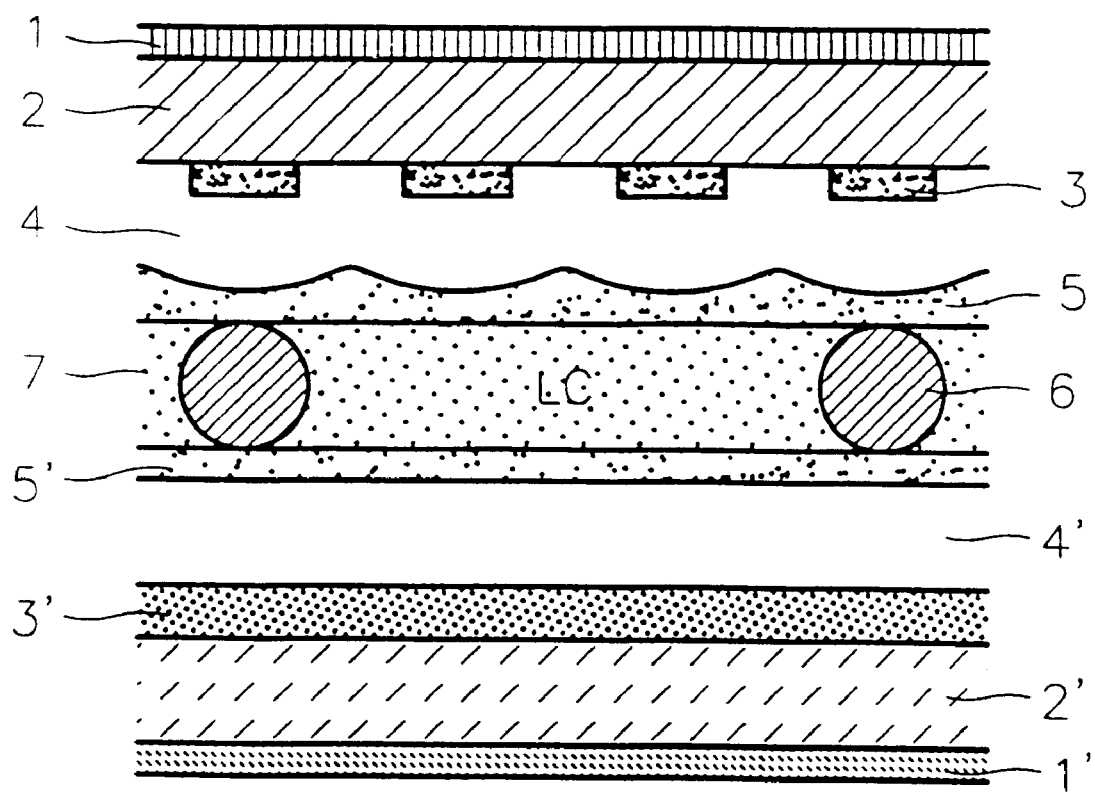
FIG. 1 is a section view of a general liquid crystal display.

The present invention is characterized in using a self-photosensitive polyimide produced by introducing a benzophenone moiety and an active hydrogen moiety to heat resistant polyimide, thereby improving thermal stability of optical alignment. Here, the self-photosensitive polyimide is aligned into a predetermined direction by light. The optical alignment composition according to the present invention comprises the self-photosensitive polyimide and a polyimide having a long chain alkyl group at its side chain. Here, the weight ratio of the self-photosensitive polyimide to the polyimide having an alkyl group at its side chain is between 99:1 and 80:20.

The weight-average molecular weight of the self-photosensitive polyimide is preferably between $5 \times 10^3$ and $2 \times 10^5$. Also, the weight-average molecular weight of the polyimide having an alkyl group at its side chain is preferably between $5 \times 10^3$ and $2 \times 10^5$.

Hereinbelow, methods of manufacturing an optical alignment composition, an alignment layer using the same and an LCD having the alignment layer according to the present invention will be described.

First, the method of synthesizing polyimide having benzopheonone and active hydrogen moieties will be explained.

Acid anhydride A and a diamine compound B and a solvent are mixed and reacted to synthesize polyamic acid C.

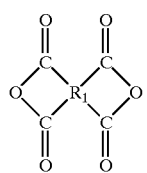

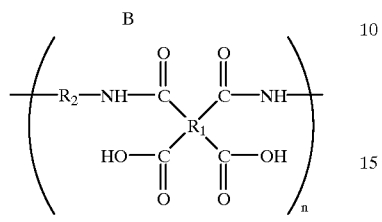

A    B

C

In the above reaction formula, $R_1$ and $R_2$ are as defined above.

The polyamic acid C is mixed with an appropriate solvent to produce the optical alignment composition to then be spin-coated on the glass substrates having transparent electrodes. At this time, the solvent is not specifically restricted but is preferably N-methyl-2-pyrrolidone (NMP), dimethylformamide (DMF) or butylcellosolve.

Then, the solvent of the resultant is dried and an imidization reaction is carried out by a thermal treatment at about 200~250° C. to form a polyimide alignment layer.

Subsequently, linear polarized light (wavelength: 300~400 nm) is irradiated to conduct a photo-reaction. Then, two substrates were sealed using a spacer with a predetermined gap maintained, thereby completing an empty cell.

Thereafter, liquid crystals are injected into the empty cell to complete an LCD.

Now, the method of synthesizing polyimide having an alkyl group at its side chain will be explained.

Acid anhydride D and a diamine compound E are reacted at 0~25° C. for 24 hours to synthesize polyamic acid F, and then the polyamic acid F is imidized to synthesize polyimide G.

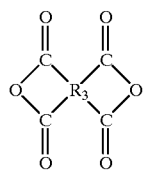

D    E

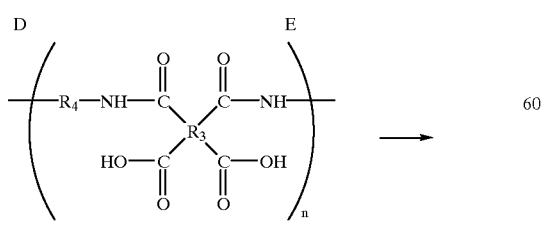

F

-continued

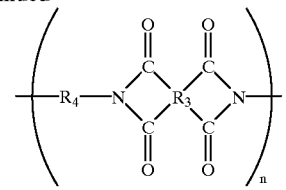

G

In the above reaction formula, $R_3$ is selected from the group consisting of

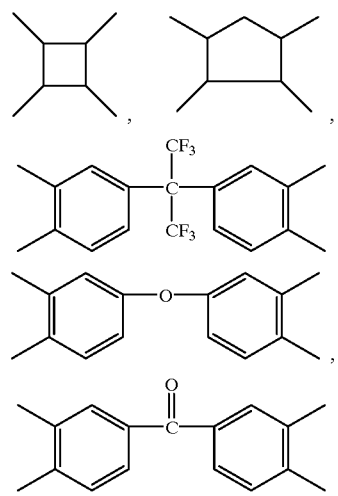

and $R_4$ is selected from the group consisting of

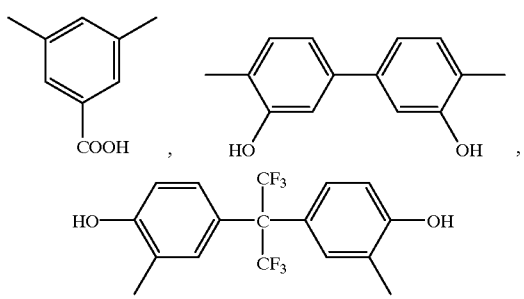

Then the polyimide G is reacted with an alkyl halide H to synthesize polyimide I having an alkyl group at its side chain.

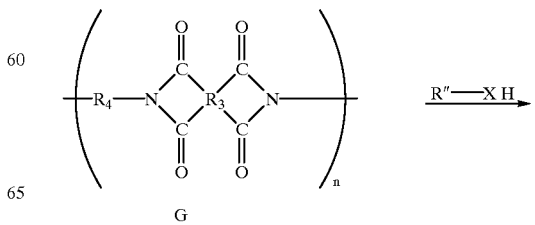

G

-continued

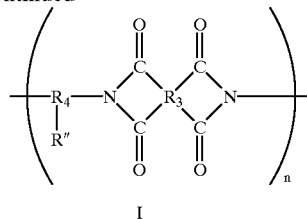

In the above reaction formula, R" denotes a $C_3$–$C_{17}$ alkyl group and X is selected from the group consisting of chloride, bromide and iodide.

Hereinbelow, the present invention will be described with reference to various embodiments, but the invention is not limited thereto.

EXAMPLE 1

2.93 g of 3,3',4,4'-benzophenonetetracarboxylic acid dianhydride, 1.29 g of 1,4-bis(aminomethyl)cyclohexane[1, 4-bis(aminomethyl)cyclohexane] and 60 g of NMP were mixed and reacted to synthesize 4.2 g (in NMP 60 ml) of polyamic acid.

Then, NMP was further added to adjust the viscosity of the composition having the polyamic acid. The composition was spin-coated on two glass substrates having ITO electrodes, and then dried at about 100° C. for 1 hour to thermally treat the resultant at about 250° C. for 2 hours to form a polyimide alignment layer.

Then, linear polarized light of about 313 nm wavelength having light intensity of about 10 mw/cm² was irradiated into the alignment layer to conduct a photo-reaction for about 5 minutes. An empty cell was manufactured by sealing two glass substrates while maintaining a predetermined gap therebetween using a spacer. An LCD was completed by injecting liquid crystals into the empty cell.

EXAMPLE 2

3.22 g of 3,3',4,4'-benzophenone tetracarboxylic acid dianhydride, 1.52 g of 3,5-diaminobenzoic acid and 60 g of NMP were mixed and stirred at an atmospheric temperature for 24 hours to synthesize polyamic acid. The polyamic acid was dehydrated to synthesize polyimide.

4.54 g (0.01 mol) of the polyimide and 1.93 g (0.01 mol) of octyl bromide were mixed and then 0.8 g of pyridine was added thereto to be reacted at 60° C. for 2 hours. The mixture of 0.02 g of the obtained polyimide, 0.18 g of polyamic acid manufactured in Example 1 and 10 g of NMP was spin-coated on two glass substrates having ITO electrodes, respectively, and then dried at about 100° C. for 1 hour to then thermally treat the resultant structure at about 250° C. for 2 hours, thereby forming an alignment layer.

Then, linear polarized light of about 330 nm wavelength was irradiated into the alignment layer to conduct a photo-reaction for about 5 minutes.

An empty cell was manufactured by sealing two glass substrates while maintaining a predetermined gap therebetween using a spacer. An LCD was completed by injecting liquid crystals into the empty cell.

Then, with respect to the LCD manufactured according to Examples 1 and 2, the alignment degree and the thermal stability of the alignment layer and the pretilt angle of the liquid crystal were measured. The alignment degree was observed through a polarizing film. The thermal stability was measured by raising the temperature up to 180–200° C., maintaining the resultant for a predetermined time at that temperature, lowering the temperature to room temperature, and then checking the deformation degree of the alignment layer through a polarizing film. The pretilt angle was measured by a crystal rotation method.

As a result, in the LCD manufactured according to Example 1, the alignment layer had a thermal stability so excellent as to scarcely deform the alignment layer even if the temperature was raised to 200° C. Also, in Example 2, the thermal stability was so excellent as not to deform the alignment layer even after the temperature was raised to 180° C. In the cases of the example 2 where a polymer having a long-chain alkyl group was used, the pretilt angle of the liquid crystal was about 5° and more remarkably improved than that of the example 1.

The present invention has the following advantages.

First, the temperature range within which the thermal stability of the alignment layer is maintained is widened up to about 200° C. As a result, an optical alignment layer having excellent thermal stability can be obtained.

Second, the pretilt angle of the liquid crystal can be increased to 0~10° by mixing a self-photosensitive polyimide with polyimide having a long chain alkyl group.

What is claimed is:

1. A self-photosensitive polyimide having a benzophenone moiety and an active hydrogen moiety, and is represented by the formula 1:

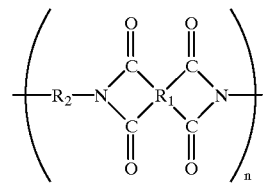

where $R_1$ is

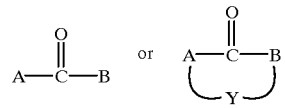

and $R_2$ is E-$CH_2$-F, where A and B are each independently selected and are an unsubstituted aromatic group, selected from aromatics comprising a monocyclic ring of six carbon atoms, a bicyclic ring of ten carbon atoms and a tricyclic ring of fourteen carbon atoms, and Y is a heteroatom selected from oxygen (O), sulfur (S) and nitrogen (N), E and F are each independently selected from the group consisting of an unsubstituted aromatic group, an aromatic group having at least one substitute (G), where the aromatic group is selected from aromatics comprising a monocyclic ring of six carbon atoms, a bicyclic ring of ten carbon atoms and a tricyclic ring of fourteen carbon atoms, a $C_3$–$C_{10}$ cycloalkyl, a $C_3$–$C_{10}$ cycloalkyl having at least one substituent (G) a $C_3$–$C_{10}$ cycloalkeny, and a $C_3$–$C_{10}$ cycloalkenyl having at least one substituent (G), where the substituent (G) is selected from the group consisting of a $C_1$–$C_{10}$ alkyl, an aromatic, unsubstituted or substituted amino, a halide, hydroxy (OH), nitro ($NO_2$), cyano (CN), thiocyano (SCN), thiol (SH) and carboxyl (COOH)) groups.

2. The optical alignment polymer of claim 1, wherein in the formula 1, $R_1$ is selected from the group consisting of:

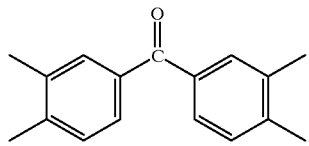

and

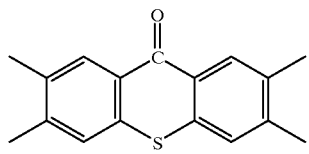

, and $R_2$ is selected from the group consisting of:

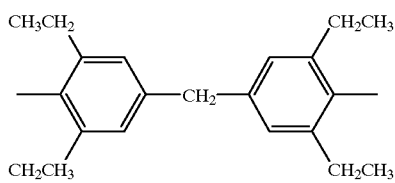

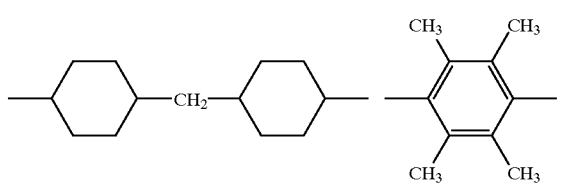

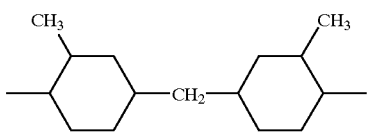

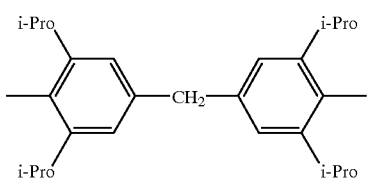

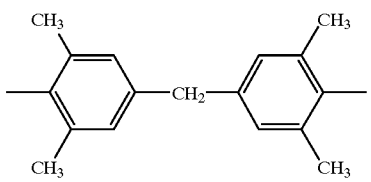

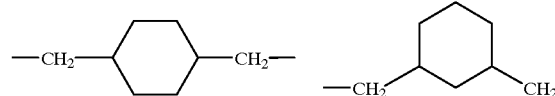

and

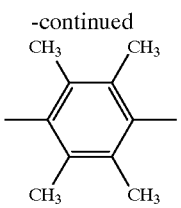

3. The optical alignment polymer of claim 1, wherein the weight-average molecular weight of the self-photosensitive polyimide is about $5 \times 10^3$ to $2 \times 10^5$.

4. An optical alignment composition comprising a self-photosensitive polyimide having a benzophenone moiety and an active hydrogen moiety, and is represented by the formula 1:

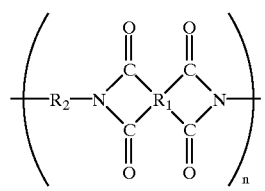

where $R_1$ is

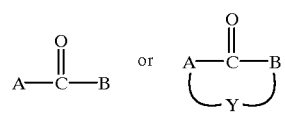

and $R_2$ is E-$CH_2$-F, where A and B are each independently selected and are an unsubstituted aromatic group selected from aromatics comprising a monocyclic ring of six carbon atoms, a bicyclic ring of ten carbon atoms or a tricyclic ring of fourteen carbon atoms, and, Y is a heteroatom selected from oxygen (O), sulfur (S) and nitrogen (N), B and F are each independently selected from the group consisting of an unsubstituted aromatic group, an aromatic group having at least one substitute (G), where the aromatic group is selected from aromatics comprising a monocyclic ring of six carbon atoms, a bicyclic ring of ten carbon atoms and a tricyclic ring of fourteen carbon atoms, a $C_3$–$C_{10}$ cycloalkyl, and a $C_3$–$C_{10}$ cycloalkyl having at least one substituent (G), a $C_3$–$C_{10}$ cycloalkenyl, a $C_3$–$C_{10}$ cycloalkenyl having at least one substituent (G), where the substituent (G) is selected from the group consisting of a $C_1$–$C_{10}$ alkyl, an aromatic, unsubstituted or substituted amino, a halide, hydroxy (OH), nitro ($NO_2$), cyano (CN), thiocyano (SCN), thiol (SH) and carboxyl (COOH)) groups.

5. The optical alignment composition of claim 4, where, in the formula 1, $R_1$ is selected from the group consisting of:

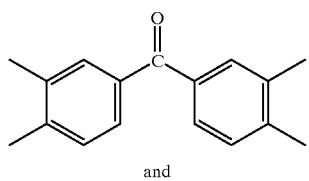

and

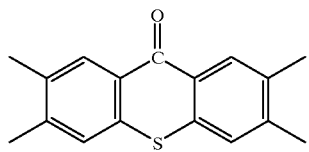

, and $R_2$ is selected from the group consisting of:

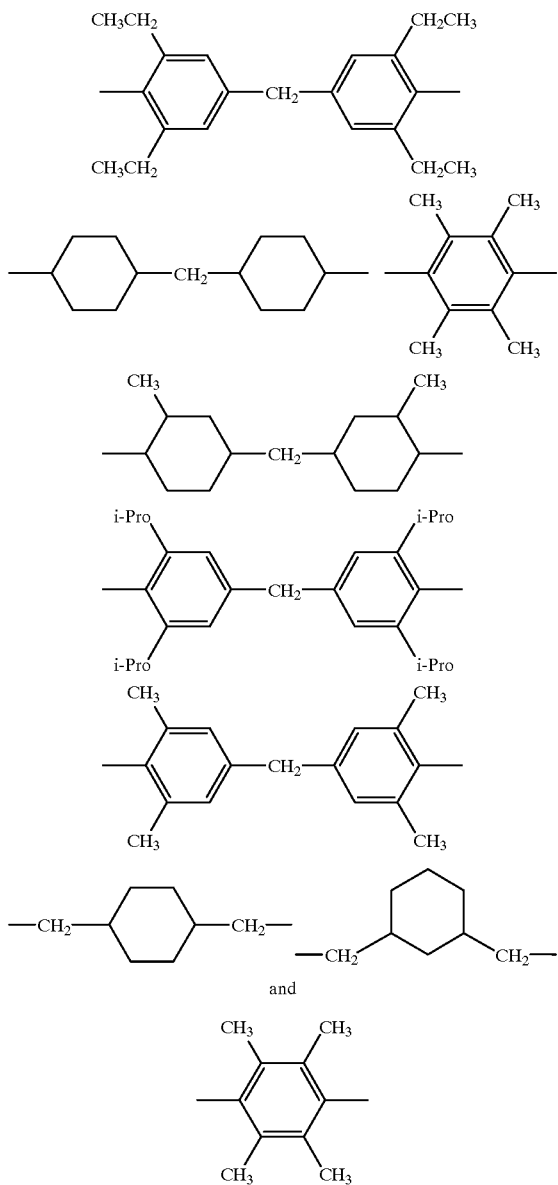

6. The optical alignment composition of claim 4, wherein the weight-average molecular weight of the self-photosensitive polyimide is about $5 \times 10^3$ to $2 \times 10^5$.

7. The optical alignment composition of claim 4, further comprising a polyimide having an alkyl group as a side chain.

8. The optical alignment composition of claim 7, wherein the weight ratio of the self-photosensitive polyimide to the polyimide having an alkyl group side chain is about 99:1 to 80:20.

9. The optical alignment composition of claim 7, wherein the weight-average molecular weights of the polyimide having an alkyl group at its side chain is about $5 \times 10^3$ to $2 \times 10^5$.

10. A liquid crystal display (LCD) comprising a pair of upper and lower substrates opposed to each other, transparent electrodes formed on the upper and lower substrates, alignment layers formed on the transparent electrodes and a liquid crystal layer between the alignment layers, wherein the alignment layer comprises self-photosensitive polyimide having a benzophenone moiety and an active hydrogen moiety and is represented by the formula 1:

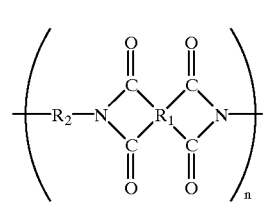

where $R_1$ is

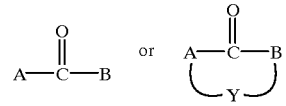

, and $R_2$ is E-CH$_2$-F, where A and B are each independently selected, and are unsubstituted aromatic group selected from aromatics comprising a monocyclic ring of six carbon atoms, a bicyclic ring of ten carbon atoms and a tricyclic ring of fourteen carbon atoms, and Y is a heteroatom selected from oxygen (O), sulfur (S) and nitrogen (N), E and F are each independently selected from the group consisting of an unsubstituted aromatic group, an aromatic group having at least one substitute (G), where the aromatic group is selected from aromatics comprising a monocyclic ring of six carbon atoms, a bicyclic ring of ten carbon atoms and a tricyclic ring of fourteen carbon atoms, a $C_3$–$C_{10}$ cycloalkyl, a $C_3$–$C_{10}$ cycloalkyl having at least one substituent (G), a $C_3$–$C_{10}$ cycloalkenyl, a $C_3$–$C_{10}$ cycloalkenyl having at least one substituent (G), where the substituent (G) is selected from the group consisting of a $C_1$–$C_{10}$ alkyl, an aromatic, unsubstituted or substituted amino, a halide, hydroxy (OH), nitro (NO$_2$), cyano (CN), thiocyano (SCN), thiol (SH) and carboxyl (COOH)) groups.

11. The LCD of claim 10, wherein in the formula 1, $R_1$ is selected from the group consisting of:

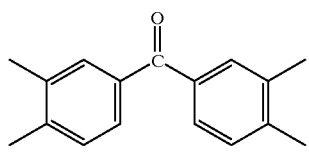

and

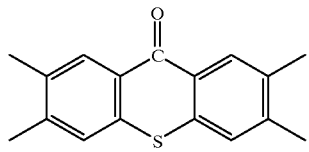

, and R₂ is selected from the group consisting of:

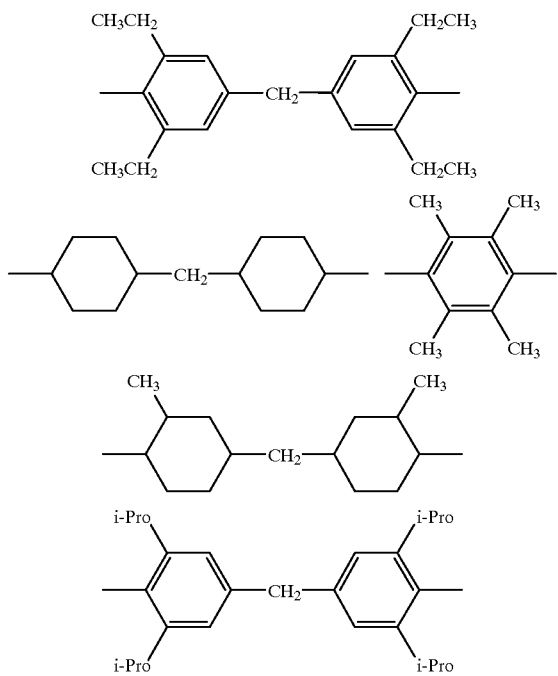

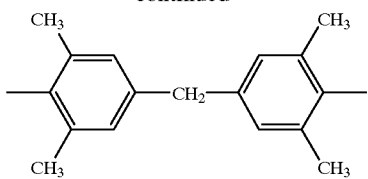

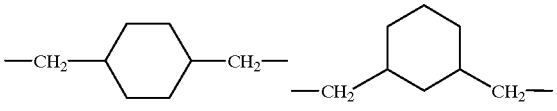

and

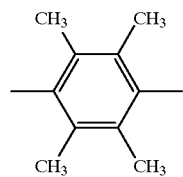

12. The LCD of claim 10, wherein the weight-average molecular weight of the self-photosensitive polyimide is about $5 \times 10^3$ to $2 \times 10^5$.

13. The LCD of claim 10, the alignment layer further comprises a polyimide having an alkyl group as a side chain.

14. The optical alignment composition of claim 13, wherein the weight ratio of the self-photosensitive polyimide to the polyimide having an alkyl group in its side chain is about 99:1 to 80:20.

15. The optical alignment composition of claim 13, wherein the weight-average molecular weight of the polyimide having an alkyl group at its side chain is about $5 \times 10^3$ to $2 \times 10^5$.

* * * * *